(12) United States Patent
Zhang

(10) Patent No.: US 10,403,553 B2
(45) Date of Patent: Sep. 3, 2019

(54) MANUFACTURING METHOD FOR DUAL WORK-FUNCTION METAL GATES

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Qingchun Zhang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/872,306

(22) Filed: Jan. 16, 2018

(65) Prior Publication Data

US 2018/0211886 A1     Jul. 26, 2018

(30) Foreign Application Priority Data

Jan. 22, 2017   (CN) .......................... 2017 1 0045041

(51) Int. Cl.
*H01L 21/02*   (2006.01)
*H01L 29/78*   (2006.01)
*H01L 21/8238* (2006.01)
*H01L 27/092*  (2006.01)
*H01L 29/51*   (2006.01)
(Continued)

(52) U.S. Cl.
CPC .............. *H01L 21/823857* (2013.01); *H01L 21/02181* (2013.01); *H01L 21/02186* (2013.01);
(Continued)

(58) Field of Classification Search
CPC .......... H01L 21/823857; H01L 27/092; H01L 29/517; H01L 29/4966; H01L 29/66545;
(Continued)

(56) References Cited

U.S. PATENT DOCUMENTS 7,332,407 B2 *  2/2008  Wang ................ H01L 21/28123
                                            257/510
8,193,051 B2 *  6/2012  Bojarczuk, Jr. ... H01L 21/28079
                                            257/E21.197
(Continued)

*Primary Examiner* — Thinh T Nguyen
(74) *Attorney, Agent, or Firm* — Kilpatrick Townsend & Stockton LLP

(57) ABSTRACT

A method for manufacturing a semiconductor device includes providing a semiconductor substrate, forming a high dielectric constant (high-k) gate dielectric layer on the semiconductor substrate, the high-k gate dielectric layer including a nitrided surface that has been subjected to a nitriding treatment or an oxidized surface that has been subjected to an oxidizing treatment, forming a metal gate on the nitrided surface of the high-k gate dielectric layer to form an NMOS transistor, or forming a metal gate on the oxidized surface of the high-k gate dielectric layer to form a PMOS transistor.

14 Claims, 5 Drawing Sheets

(51) Int. Cl.
*H01L 29/66* (2006.01)
*H01L 21/28* (2006.01)
*H01L 29/49* (2006.01)

(52) U.S. Cl.
CPC .. *H01L 21/28088* (2013.01); *H01L 21/28202* (2013.01); *H01L 21/28211* (2013.01); *H01L 27/092* (2013.01); *H01L 29/517* (2013.01); *H01L 29/66545* (2013.01); *H01L 21/823842* (2013.01); *H01L 29/4966* (2013.01); *H01L 29/78* (2013.01)

(58) Field of Classification Search
CPC ......... H01L 21/28088; H01L 21/28202; H01L 21/28211; H01L 21/02181; H01L 21/02186
USPC ........ 257/369, 368, 370, 371; 438/199, 208, 438/207, 219
See application file for complete search history.

(56) References Cited

U.S. PATENT DOCUMENTS

| | | | | |
|---|---|---|---|---|
| 8,754,488 | B2* | 6/2014 | Cheng | H01L 21/76831 |
| | | | | 257/413 |
| 8,772,115 | B2* | 7/2014 | Son | H01L 21/823857 |
| | | | | 257/E21.635 |
| 9,331,161 | B1* | 5/2016 | Lee | H01L 29/66545 |
| 2007/0029588 | A1* | 2/2007 | Niimi | H01L 21/28202 |
| | | | | 257/288 |
| 2007/0138563 | A1* | 6/2007 | Callegari | H01L 21/823842 |
| | | | | 257/369 |
| 2011/0165767 | A1* | 7/2011 | Bojarczuk, Jr. | H01L 21/28079 |
| | | | | 438/586 |
| 2013/0249020 | A1* | 9/2013 | Cheng | H01L 21/76831 |
| | | | | 257/407 |
| 2013/0316525 | A1* | 11/2013 | Son | H01L 21/823857 |
| | | | | 438/591 |

* cited by examiner

MANUFACTURING METHOD FOR DUAL WORK-FUNCTION METAL GATES

CROSS-REFERENCES TO RELATED APPLICATIONS

The present application claims priority to Chinese patent application No. 201710045041.6, filed with the State Intellectual Property Office of People's Republic of China on Jan. 22, 2017, the content of which is incorporated herein by reference in its entirety.

FIELD OF THE INVENTION

The present disclosure relates to semiconductor technology, and more particularly to a semiconductor device having dual work-function metal gates and manufacturing method thereof.

BACKGROUND OF THE INVENTION

With the development of integrated circuit technology, the feature sizes of semiconductor devices are getting smaller and smaller. Current complementary metal-oxide semiconductor (CMOS) devices use a high dielectric-constant (high-k) material as the gate dielectric layer and a metal as the gate electrode (HKMG).

For NMOS and PMOS devices, the expected work function of the metal gate is quite different, which is about 4.1 eV to about 4.4 eV and about 4.8 eV to about 5.1 eV, respectively. In the prior art, in order to obtain a work function of the metal gate suitable for NMOS and PMOS devices, different types of metal materials (different work functions) are generally used for metal gates of NMOS and PMOS devices. However, this increases the challenge and limitation of the material selection and associated processes. Further, in the case where the NMOS and PMOS devices have interconnected gates and are relatively close to an electric circuit, e.g., a static random access memory (SRAM), different types of metal gate materials between the NMOS and PMOS devices are very prone to cross-diffusion between the metal gates, resulting in an abnormal threshold voltage.

Therefore, it is desirable to ensure a proper metal gate work function. Further, in the case of CMOS devices, it is also desirable to form metal gates having dual work functions and there is no cross-diffusion between the dual work functions of the metal gates.

Additionally, it is desirable to enable a semiconductor device to obtain a lower equivalent oxide thickness (EOT) and to reduce the gate leakage current. In conventional processes, a gate dielectric layer typically includes an interface layer (IL) and a high dielectric-constant dielectric layer. In order to obtain a lower EOT, it is necessary to reduce the physical thickness of the interface layer and/or the high dielectric-constant dielectric layer. However, this results in an increase in the gate leakage current. Thus, it is desirable to obtain a lower EOT without reducing the physical thickness of the gate dielectric layer.

BRIEF SUMMARY OF THE INVENTION

In view of the above problems, the present inventor has discovered that, by performing different treatments on the surface of the gate dielectric layer that is in contact with the metal gate, the interface between the gate dielectric layer and the metal gate can be affected, so that the effective work function of the metal gate can be adjusted. Specifically, performing a nitriding treatment on the surface of the gate dielectric layer can reduce the effective work function of the metal gate; and performing an oxidizing treatment on the surface of the gate dielectric layer can increase the effective work function of the metal gate. Therefore, a desired gate work function can be obtained by simply performing a corresponding process treatment on the surface of the gate dielectric layer. A metal gate material and associated process can thus be more freely selected.

For example, in the case where an MOS device uses silicon as a semiconductor material, a metal gate work function can be easily set to about 4.1 eV to about 4.4 eV for an NMOS device by nitriding the surface of the gate dielectric layer. And the dielectric constant of the gate dielectric layer can be increased in the case where the entire gate dielectric layer is nitrided, thereby reducing the EOT of the NMOS and PMOS devices, so that the gate leakage becomes small. In addition, by oxidizing the surface of the gate dielectric layer, the metal gate work function can be easily set to about 4.8 eV to about 5.1 eV for the PMOS device.

Since the work function of an NMOS metal gate and the work function of a PMOS metal gate can be set by separately performing a nitriding treatment and an oxidizing treatment on the surface of the gate dielectric layer, respectively, in the case of manufacturing a CMOS device, a same metal gate material can be used for the gates of the NMOS and PMOS devices. This prevents the cross-diffusion between the NMOS and PMOS metal gate materials and simplifies a gate trench filling process and a subsequent planarizing process.

Thus, in one aspect, the present invention provides a method of manufacturing a semiconductor device. The method includes providing a semiconductor substrate, forming a gate dielectric layer having a high dielectric constant on the semiconductor substrate, performing a nitriding or oxidizing treatment on a surface of the gate dielectric layer to form a nitrided surface or an oxidized surface, and forming a metal gate on the nitrided surface of the gate dielectric layer to form an NMOS transistor, or forming a metal gate on the oxidized surface of the gate dielectric layer to form a PMOS transistor.

In another aspect of the present invention, a semiconductor device is provided. The semiconductor device includes a semiconductor substrate, and a transistor on the semiconductor substrate. The transistor includes a gate dielectric layer having a high dielectric constant on the semiconductor substrate, and a metal gate on the gate dielectric layer. The transistor is an NMOS transistor, and the gate dielectric layer of the NMOS transistor has a nitrided surface. Or, the transistor is a PMOS transistor, and the gate dielectric layer of the PMOS transistor has an oxidized surface.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
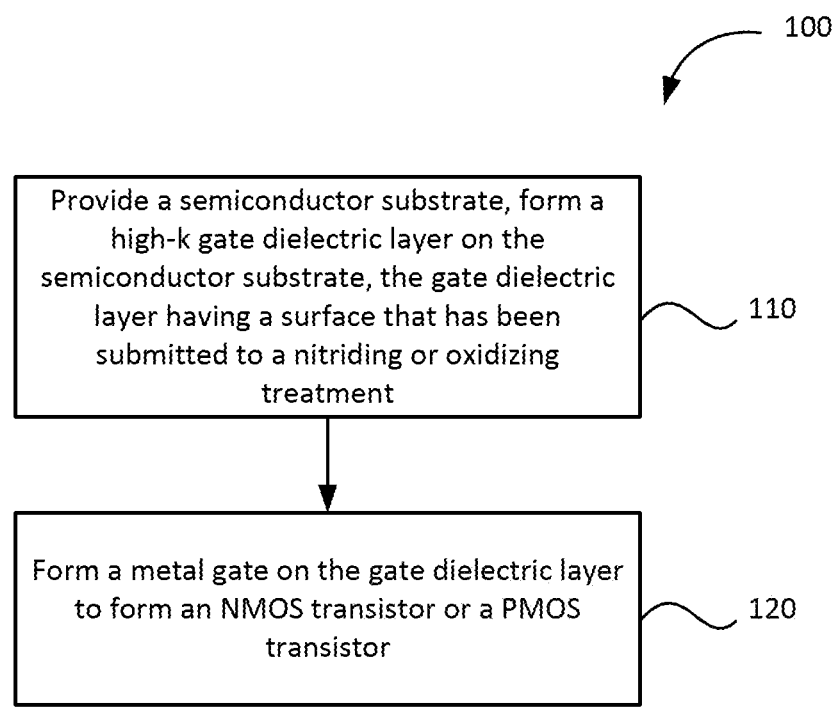
FIG. 1 is a simplified flowchart illustrating a method of manufacturing a semiconductor device according to a first embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably. The terms "metal material" and "metallic material" are used interchangeably.

Embodiments of the present invention now will be described more fully hereinafter with reference to the accompanying drawings, in which embodiments of the invention are shown. This invention may, however, be embodied in many different forms and should not be construed as limited to the embodiments set forth herein.

First Embodiment

FIG. 1 is a simplified flowchart illustrating a method 100 of manufacturing a semiconductor device according to a first embodiment of the present invention. Method 100 may include, at step 110, providing a semiconductor substrate, and forming a high dielectric constant (high-k) gate dielectric layer on the semiconductor substrate. The high-k gate dielectric layer has a surface that has been subjected to a nitriding or oxidizing treatment. The semiconductor substrate is of a semiconductor material (e.g., Si, SiC, SiGe, etc.). The semiconductor substrate may include other device components, e.g., shallow trench isolation (STI), wells and/or other components formed in previous process steps.

Alternatively, prior to forming the high-k gate dielectric layer, an interface layer (e.g., $SiO_2$) may be formed on the semiconductor substrate using a thermal growth or deposition process to improve the interface state between the high-k gate dielectric layer and the semiconductor substrate.

The gate dielectric layer may be formed using different processes, such as a chemical vapor deposition (CVD) process. The gate dielectric layer may be formed of a dielectric material having a high dielectric constant such as $HfO_2$, $TiO_2$, or $ZrO_2$.

The effective work function of a subsequently formed metal gate on a semiconductor device may be adjusted by performing a nitriding or oxidizing treatment on the surface of the gate dielectric layer. Alternatively, the entire layer of the gate dielectric layer can be submitted to a nitriding treatment to reduce the effective work function of a subsequently formed metal gate while reducing the EOT of an MOS device at the same time.

The surface of the gate dielectric layer may be subjected to a nitriding or oxidizing treatment in a variety of ways. Second and third embodiments, that will be described in detail below, utilize different ways to perform the nitriding or oxidizing treatment on the surface of the gate dielectric layer. It is noted that the second and third embodiments are merely provided as example embodiments. However, the present invention should not be limited by any of these exemplary embodiments.

Next, at step 120, a metal gate is formed on the nitrided surface of the gate dielectric layer to form an NMOS transistor, or a metal gate is formed on the oxidized surface of the gate dielectric layer to form a PMOS transistor.

Since a desired gate work function can be adjusted by subjecting the surface of the gate dielectric layer to a nitriding treatment or an oxidizing treatment, a material and an associated process can be more freely selected to form a metal gate.

The metal gate can be formed using a conventional replacement metal gate fabrication process. The metal gate can be a single metal layer or a stack of multiple metal layers. A planarization (e.g., CMP) process can then be performed on the formed metal layer.

In one embodiment, a CMOS device may be formed on the semiconductor substrate, i.e., PMOS and NMOS transistors are both formed on the semiconductor substrate, and the surface of the gate dielectric layer of the NMOS transistor has been subjected to a nitriding treatment, and the surface of the gate dielectric layer of the PMOS transistor has been subjected to an oxidizing treatment. At this time, the metal gate of the NMOS transistor and the metal gate of the PMOS transistor may be formed of the same metallic material. The metallic material may be a mid-gap metallic material. A mid-gap metallic material refers to a metallic material having a metal work function in the vicinity of the middle of (i.e., about halfway between) the conduction band and the valance band of a semiconductor material. For a semiconductor device having a silicon substrate, the mid-gap metallic material means that the metal work function of the metallic material is about 4.6 eV. The metallic material may be, e.g., TiN or TaN. Since the same metal gate material can be used as the gate for both NMOS and PMOS devices, a cross-diffusion between the NMOS and PMOS metal gate materials can be avoided that simplifies the filling of the gate trench and a subsequent planarization process.

In addition, both the oxidizing and nitriding treatments are performed in forming a CMOS device. The order of performing the oxidizing and nitriding treatments can be determined based on process requirements. That is, the nitriding treatment can first be performed, followed by the oxidizing treatment, or the oxidizing treatment can first be performed, followed by the nitriding treatment. In a specific embodiment, the gate dielectric layer of the PMOS transistor can be first nitrided to increase the dielectric constant, and then the surface of the gate dielectric is subjected to an oxidizing treatment to adjust the work function.

Second Embodiment

Figure 2:
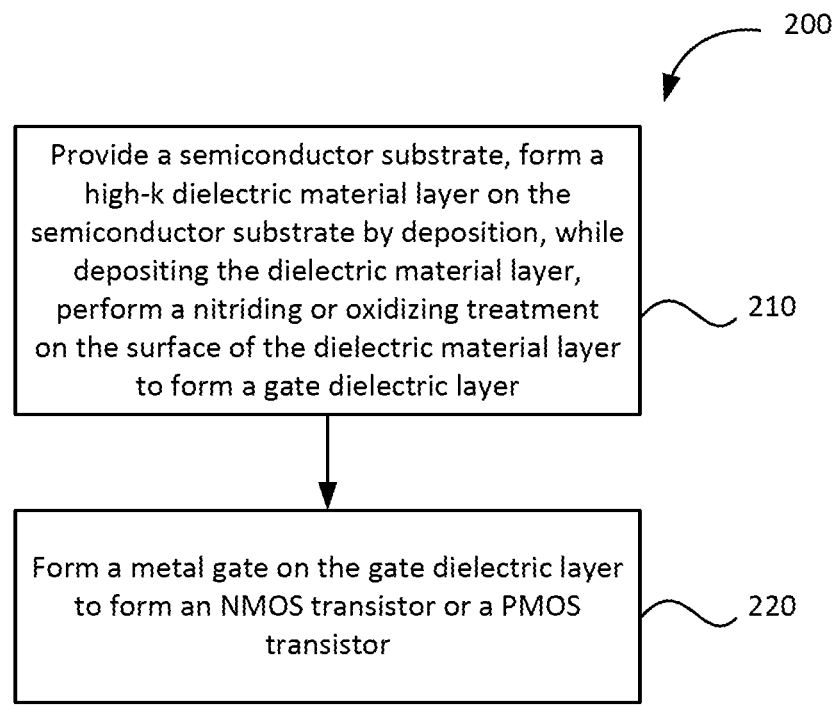
FIG. 2 is a simplified flowchart illustrating a method of manufacturing a semiconductor device according to a second embodiment of the present invention.

FIG. 2 is a simplified flowchart illustrating a method 200 of manufacturing a semiconductor device according to a second embodiment of the present invention. Method 200 is a specific embodiment of the first embodiment that has been described in above sections. Technical details not described herein may be referred to the corresponding description of the first embodiment.

Method 200 may include, at step 210, providing a semiconductor substrate, and forming a high dielectric constant (high-k) dielectric material layer on the semiconductor substrate using a deposition process. In the deposition process, a nitriding or oxidizing treatment is performed on the surface of the dielectric material layer so that the surface of the dielectric material layer is doped with nitrogen ions or oxygen ions. The dielectric material layer may be deposited using a variety of processes, e.g., a CVD process. The dielectric material layer may include $HfO_2$, $TiO_2$, or $ZrO_2$.

Step 220 is similar to above-described step 110. A metal gate is formed on the nitrided surface of the dielectric material layer to form an NMOS transistor, or a metal gate is formed on the oxidized surface of the dielectric material layer to form a PMOS transistor. Details of step 220 may be referred to the description of step 110 and will be omitted herein for the sake of brevity.

According to the second embodiment of the present invention, the nitriding or oxidizing treatment on the surface of the dielectric material layer can be performed while forming the dielectric material layer (gate dielectric layer), so that the manufacturing process can be simplified without adding additional process steps.

Third Embodiment

Figure 3:
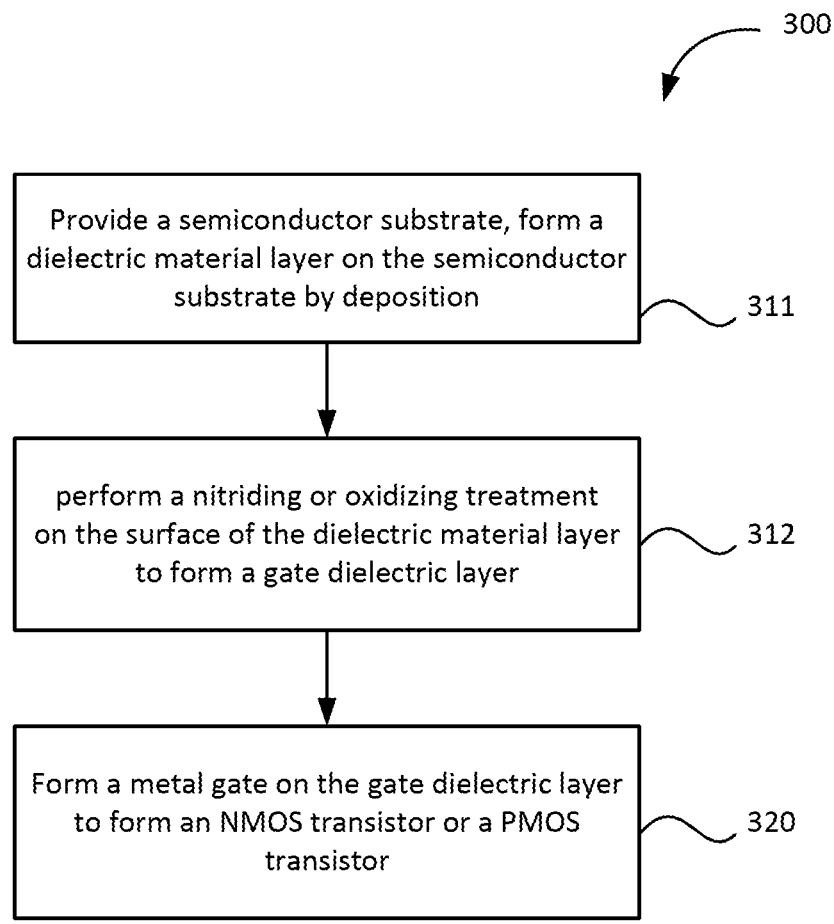
FIG. 3 is a simplified flowchart illustrating a method of manufacturing a semiconductor device according to a third embodiment of the present invention.

FIG. 3 is a simplified flowchart illustrating a method 300 of manufacturing a semiconductor device according to a third embodiment of the present invention. Method 300 is another specific embodiment of the first embodiment that has been described in above sections. Technical details not described herein may be referred to the corresponding description of the first embodiment.

Method 300 may include, at step 310, providing a semiconductor substrate, and forming a high-k dielectric material layer on the semiconductor substrate using a deposition process. The dielectric material layer may be deposited using a variety of processes, such as a CVD process. The dielectric material layer may include $HfO_2$, $TiO_2$, or $ZrO_2$.

At step 312, a nitriding or oxidizing treatment is performed on the surface of the dielectric material layer to form a gate dielectric layer having at least a nitrided surface or an oxidized surface.

In one embodiment, the nitriding treatment may include a decoupling plasma nitriding (DPN) process or a rapid thermal annealing process in an ammonia environment. In one embodiment, the nitriding treatment is performed at a temperature below 750° C. The process parameters of the nitriding treatment depend on the material of the gate dielectric layer, the metal gate material and the thicknesses associated with the gate dielectric layer and the metal gate. Through an appropriate nitriding treatment, the metal gate work function for an NMOS device can be set to about 4.1 eV to about 4.4 eV.

In one embodiment, the oxidizing treatment may include a rapid thermal annealing process in an oxygen-containing environment, a decoupling plasma oxidizing (DPO) treatment, or an ozone treatment. In one embodiment, the oxidizing treatment is performed at a temperature below 400° C. The process parameters of the oxidizing treatment depend on the material of the gate dielectric layer, the metal gate material and the thicknesses associated with the gate dielectric layer and the metal gate. Through an appropriate oxidizing treatment, the metal gate work function for a PMOS device can be set to about 4.8 eV about 5.1 eV.

Step 320 is similar to above-described step 110. A metal gate is formed on the nitrided surface of the dielectric material layer to form an NMOS transistor, or a metal gate is formed on the oxidized surface of the dielectric material layer to form a PMOS transistor. Details of step 320 may be referred to the description of step 110 and will be omitted herein for the sake of brevity.

In the case of a CMOS device using a replacement gate process, a method according to one embodiment of the present invention may include providing a semiconductor substrate, forming a dielectric material layer having a high dielectric constant (high-k) on the semiconductor substrate, performing a nitriding treatment on the entire dielectric material layer to form a nitrided dielectric material layer, forming a first dummy gate of a PMOS device and a second dummy gate of an NMOS device on the entire nitrided dielectric material layer, and forming a source region and a drain region on opposite sides of the PMOS and NMOS devices, respectively. The method also includes removing the first dummy gate, and then performing an oxidizing treatment on a surface portion of the dielectric material layer below the removed first dummy gate to form an oxidized gate dielectric layer of the PMOS device, forming a metal gate on the oxidized gate dielectric layer of the PMOS device. The method also includes removing the second dummy gate, performing a nitriding treatment on a surface portion of the dielectric material layer below the second dummy gate to form a nitrided gate dielectric layer of the NMOS device, and forming a metal gate on the nitrided gate dielectric layer of the NMOS device.

The method of the third embodiment is particularly advantageous for manufacturing a CMOS device comparing to that of the second embodiment. Specifically, in manufacturing the CMOS device, the method of the second embodiment requires the respective nitrogen and oxygen doping for the PMOS and NMOS devices, respectively, therefore, the method requires an additional photolithography process step, and the additional photolithography process and associated steps may lower the quality of the gate dielectric layer. The manufacturing method according to the third embodiment does not require additional photolithography processes on the gate dielectric layer.

Specific Embodiment

For a more complete and comprehensive understanding of the present invention, a specific embodiment of a method for manufacturing of a semiconductor device according to the third embodiment will be described in detail below using a CMOS device as an example. It is understood that this exemplary embodiment is not intended to be construed as limiting the scope of the invention. For example, the present invention is not limited to the specific structure of the MOS device shown, but is applicable to MOS devices having similar structures and operating principles.

FIGS. 4A to 4F are cross-sectional views illustrating intermediate stages of a semiconductor device in the manufacturing method according to the third embodiment of the present invention.

Figure 4A:
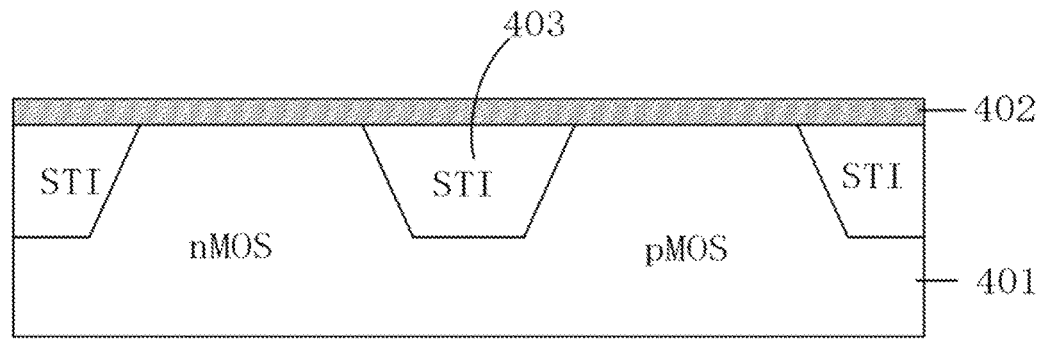
FIGS. 4A to 4F are cross-sectional views illustrating intermediate stages of a semiconductor device in the manufacturing method according to the third embodiment of the present invention.

Referring to FIG. 4A, a substrate 401 is provided. Substrate 401 may be of any semiconductor material, e.g., Si, Ge, SiGe, and any other materials. Substrate 401 may be a silicon-on-insulator (SOI) substrate. Substrate 401 may include a shallow trench isolation (STI) 403 or any other suitable isolation structure between regions of a semiconductor device for physically insulating PMOS and NMOS regions. Substrate 401 may include other components and structures previously formed, these components and structures may be present but not shown in the drawing figures for simplicity and clarity. A dielectric material layer 402 having a high dielectric constant may be formed on substrate 401 using a chemical vapor deposition process. Dielectric layer 402 may include, but not limited to, $HfO_2$, $TiO_2$, or a suitable ternary compound. In one embodiment, an interface layer may be formed between dielectric material layer 402 and semiconductor substrate 401 to improve the interface between dielectric material layer 402 and semiconductor substrate 401.

Figure 4B:
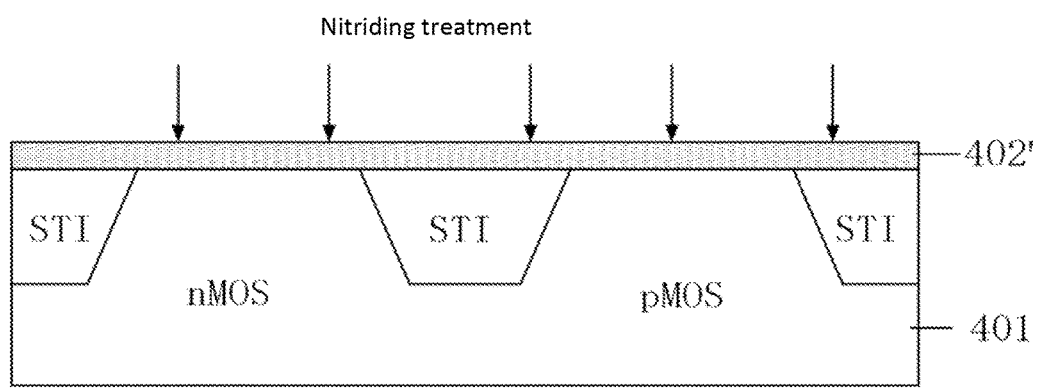

Referring to FIG. 4B, a nitriding treatment is performed on dielectric material layer 402 to form a nitrided dielectric material layer 402'. The nitriding treatment may be performed through one of the three above-described embodiments. Through the nitriding treatment, the effective work function of a metal gate can be adjusted to about 4.1 eV to about 4.4 eV. Further, the nitriding treatment increases the dielectric constant of dielectric material layer 402, thereby reducing the EOT of dielectric material layer 402 and the gate leakage of the NMOS and PMOS transistors.

Figure 4C:
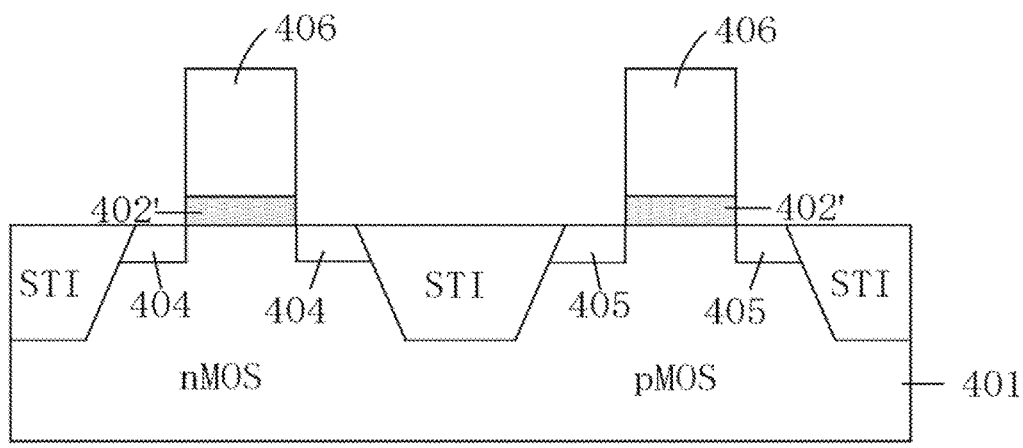

Referring to FIG. 4C, a conventional replacement gate process is performed. Specifically, a dummy gate 406 of a PMOS transistor and a dummy gate 406 of an NMOS transistor are formed on nitrided dielectric material layer 402'. Dummy gates 406 are structures that define the geometry shape of later formed metal gates of NMOS and PMOS transistors. Dummy gates 406 are subsequently removed, and at their place gate structures for operating the respective NMOS and PMOS transistor are formed, as further described below. Dummy gates 406 may be formed on nitrided dielectric material layer 402' using conventional processes known in the art (e.g., deposition, photolithography patterning and etching). In one embodiment, dummy gates 406 may be a polysilicon layer, and a cap layer may be present between dummy gates 406 and nitrided dielectric material layer 402' as a stop layer when dummy gates 406 are subsequently removed. The cap layer may have the same material as the material of a subsequently formed metal gate.

In one embodiment, spacers (not shown) are formed on opposite sides of dummy gates 406. The spacers may include a dielectric material. The spacers may be formed using conventional processes known in the art, e.g., deposition and anisotropic etching. Thereafter, source and drain regions 404 of an NMOS transistor are formed on opposite sides of dummy gate 406, preferably on sides adjacent to the spacers. And source and drain regions 405 of a PMOS transistor are formed on opposite sides of dummy gate 406 in substrate 401, preferably on sides adjacent to the spacers.

Source and drain regions 404 and source and drain regions 405 may be formed by ion implantation and annealing treatment or by any other suitable processes. In one embodiment, source and drain regions 405 may be formed with embedded SiGe. Those skilled in the art will appreciate that, in addition to the processes and structures shown in the figures, the invention may also include other processes and structures necessary to form a semiconductor device.

Figure 4D:
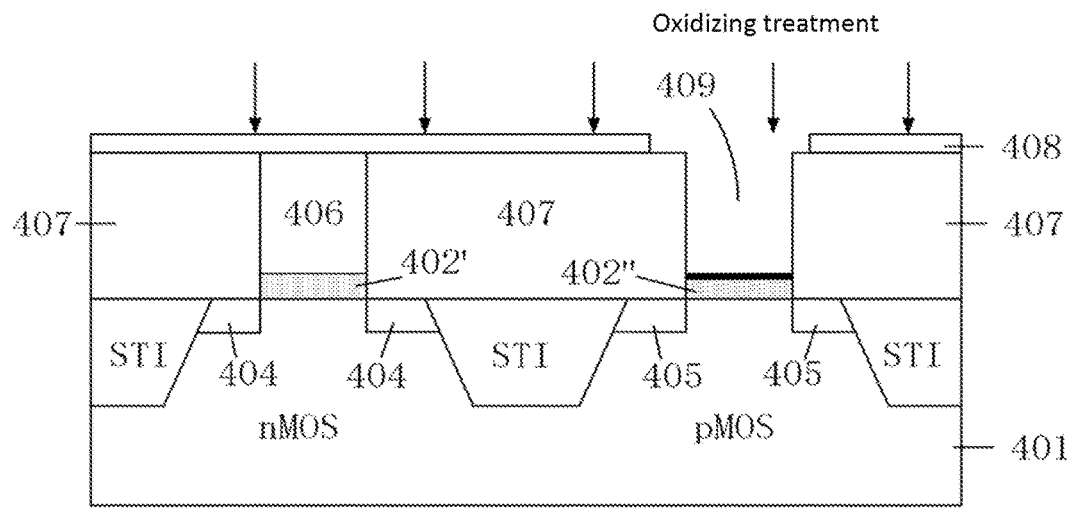

Referring to FIG. 4D, dummy gate 406 of the PMOS transistor is removed, and the exposed portion of the underlying dielectric material layer portion is subjected to an oxidizing treatment to form an oxidized dielectric material layer 402". The oxidizing treatment may be performed, for example, using the same processes of the third embodiment. In one embodiment, removing the dummy gate of the PMOS transistor and performing the oxidizing treatment may include the following processes: First, an interlayer dielectric layer (ILD) 407 is deposited, and a contact etch stop layer (CESL) is optionally deposited, then a planarization process is performed on the interlayer dielectric layer to expose a surface of dummy gate 406. A patterned hardmask 408 is then formed exposing the dummy gate region of the PMOS transistor while covering the NMOS region. Dummy gate 406 of the PMOS transistor is removed using a wet etching process and/or a dry etching process to form a cavity 409. In the embodiment where dummy gate 406 is in direct contact with dielectric material layer 402', dummy gate 406 of the PMOS transistor is removed exposing a nitrided portion of dielectric material layer 402'. Alternatively, in the embodiment where there is a cap layer between dummy gate 406 and dielectric material layer 402', dummy gate 406 is etched to exposed the cap layer. Thereafter, an oxidizing treatment is performed on the semiconductor device so that the surface of dielectric material layer 402 below dummy gate 406 of the PMOS transistor is oxidized. For the example embodiment of etching dummy gate 406 to expose the cap layer, the cap layer has a thickness less than 50 angstroms, so that oxidants in the oxidation treatment can penetrate the cap layer to reach the interface with the dielectric material layer, thereby forming a gate dielectric layer 402" having an oxidized upper surface.

Figure 4E:
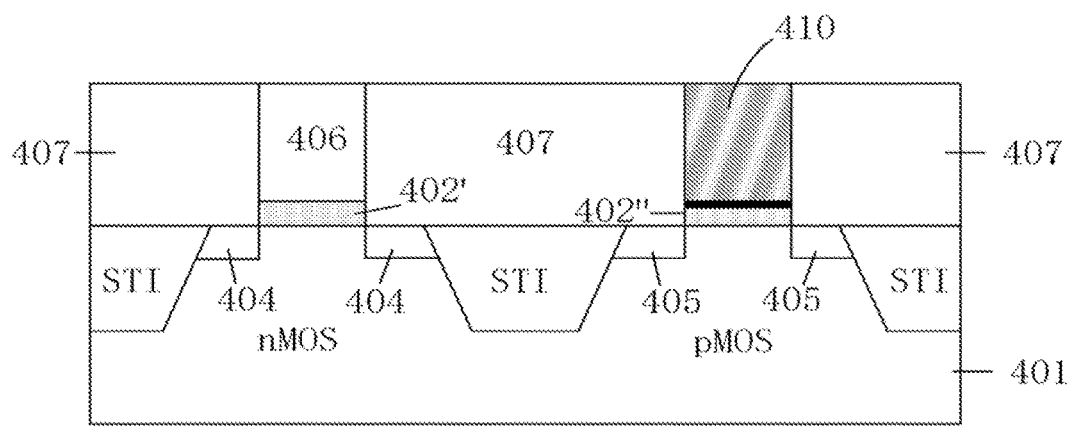

Referring to FIG. 4E, a metal gate material is deposited on the gate dielectric layer of the PMOS transistor in cavity 409. Thereafter, a chemical mechanical polishing (CMP) process is performed to remove metal residue from the upper surface of each structure (i.e., residue on the upper surface of the spacers and the ILD layer) to form a metal gate 410 of the PMOS transistor.

Figure 4F:
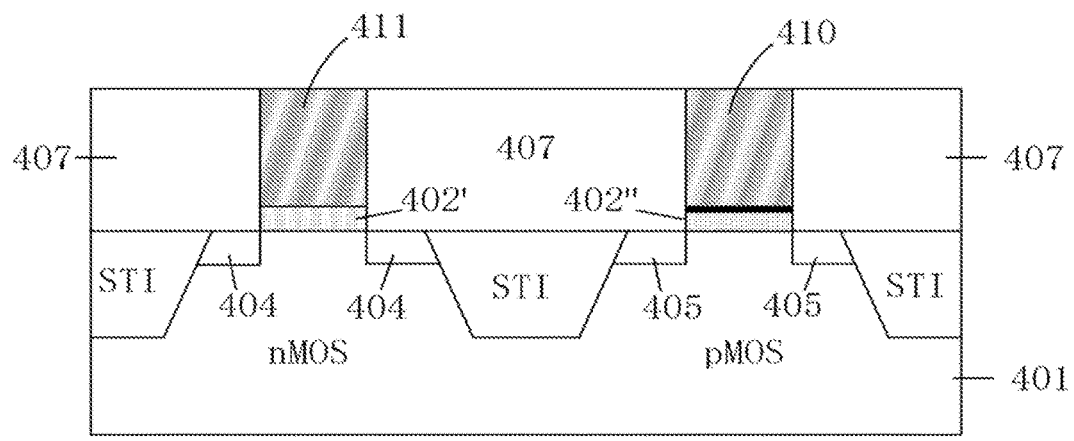

Next, referring to FIG. 4F, the dummy gate of the NMOS transistor is etched using a conventional etch process to expose an underlying portion of the dielectric material layer. Next, a metal gate material is deposited on the gate dielectric layer of the NMOS transistor in the location of the removed dummy gate. Thereafter, a chemical mechanical polishing (CMP) process is performed to planarize the metal gate material to form a metal gate 411 of the NMOS transistor. Metal gates 410 and 411 may be formed using any metal necessary to satisfy specifications of the gate work function and gate leakage required by the PMOS and NMOS transistors to obtain optimized performance. In one embodiment, the PMOS and NMOS transistors can use the same gate metallic material to avoid cross-diffusion between the metal gates of the PMOS and NMOS transistors. In one embodiment, the gate metal material may be a mid-gap metal material and includes one of TiN, TaN, or a combination thereof. The metal gate may include a single layer structure or a stacked layered metal structure. The metal gate may be deposited using any conventional deposition processes including, but not limited to, atomic layer deposition (ALD), chemical vapor deposition (CVD), low pressure chemical vapor deposition (LPCVD), plasma enhanced chemical vapor deposition (PECVD), molecular beam epitaxial (MBE), physical vapor deposition, sputtering, electroplating, evaporation, spin coating, ion beam deposition, electron beam deposition, or any combination thereof.

Alternatively, after performing processes of FIG. 4D, dummy gate 406 of the NMOS transistor may be removed, then a metal gate material is deposited on the gate dielectric layer of the NMOS transistor in the location of the removed dummy gate followed by a CMP process without first performing processes of FIG. 4E. By utilizing this alternative method, the metal gate of the NMOS transistor and the metal gate of the PMOS transistor can be formed of the same metallic material and simplifies the gate filling and subsequent planarization process.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a semiconductor device, comprising:
   providing a semiconductor substrate;
   forming a high dielectric constant (high-k) gate dielectric layer on the semiconductor substrate;
   performing a nitriding treatment on the high-k gate dielectric layer to form a nitrided high-k gate dielectric layer;
   forming an interlayer dielectric layer on the semiconductor substrate and the nitrided high-k gate dielectric layer exposing a surface portion of the nitrided high-k gate dielectric layer;
   performing an oxidizing treatment on the exposed surface portion of the nitrided high-k gate dielectric layer to form an oxidized surface portion of the nitrided high-k gate dielectric layer;
   forming a metal gate on a nitrided surface portion of the nitrided high-k gate dielectric layer to form an NMOS transistor; and
   forming a metal gate on the oxidized surface portion of the nitrided high-k gate dielectric layer to form a PMOS transistor.

2. The method of claim 1, wherein the high-k gate dielectric layer is entirely subjected to the nitriding treatment.

3. The method of claim 1, wherein the nitriding treatment comprises a decoupling plasma nitriding treatment or a rapid thermal annealing in an ammonia environment.

4. The method of claim 1, wherein the nitriding treatment is performed at a temperature below 750° C.; or
   the oxidizing treatment is performed at a temperature below 400° C.

5. The method of claim 1, wherein the high-k gate dielectric layer comprises $HfO_2$ or $TiO_2$.

6. The method of claim 1, wherein the metal gate of the NMOS transistor and the metal gate of the PMOS transistor are of a same metallic material.

7. The method of claim 6, wherein the metallic material is a mid-gap metallic material.

8. The method of claim 6, wherein the metallic material comprises TiN or TaN.

9. The method of claim 1, wherein forming the metal gate comprises:
   forming a first dummy gate of the PMOS transistor and a second dummy gate of the NMOS transistor on the nitrided high-k gate dielectric layer;
   forming a source region and a drain region on opposite sides of the first dummy gate of the PMOS transistor and a source region and a drain region on opposite sides of the second dummy gate of the NMOS transistor;
   removing the first dummy gate exposing the surface portion of the nitrided high-k gate dielectric layer;
   performing the oxidizing treatment on the surface portion of the nitrided high-k gate dielectric layer below the removed first dummy gate to form the oxidized surface portion of the nitride high-k gate dielectric layer;
   forming the metal gate on the oxidized surface portion of the high-k gate dielectric layer for the PMOS transistor;
   removing the second dummy gate to expose the nitrided surface portion of the nitrided high-k gate dielectric layer below the removed second dummy gate;
   forming the metal gate on the exposed nitrided surface portion of the nitrided high-k gate dielectric layer for the NMOS transistor.

10. The method of claim 9, further comprising:
forming a cap layer between the nitrided high-k gate dielectric layer and the first dummy gate, the cap layer having a thickness less than 50 angstroms;
removing the first dummy gate; and
performing the oxidizing treatment on the exposed surface portion of the nitrided high-k gate dielectric layer below the removed first dummy gate comprises:
removing the first dummy gate to expose the cap layer;
performing the oxidizing treatment through the cap layer to form the oxidized surface portion of the gate dielectric layer.

11. The method of claim 9, further comprising, after forming the first dummy gate and the second dummy gate:
forming the interlayer dielectric layer on the first dummy gate and the second dummy gate;
planarizing the interlayer dielectric layer to expose an upper surface of the first dummy gate and an upper surface of the second dummy gate;
forming a patterned hardmask on the second dummy gate while exposing the first dummy gate; and
removing the first dummy gate.

12. The method of claim 1, wherein the oxidizing treatment comprises a rapid thermal annealing in an oxygen-containing environment, a decoupling plasma oxidation treatment, or an ozone treatment.

13. The method of claim 1, wherein performing the nitriding treatment comprises implanting nitrogen ions to a surface of the high-k gate dielectric layer.

14. The method of claim 1, wherein performing the oxidizing treatment comprises implanting oxygen ions to a surface of the high-k gate dielectric layer.

* * * * *